US012693326B2

(12) United States Patent　　　(10) Patent No.:　US 12,693,326 B2

Tomohiro et al.　　　　　　　　　　(45) Date of Patent:　　　Jul. 28, 2026

(54) INSPECTION DEVICE AND ELECTRONIC CONTROL DEVICE

(71) Applicant: DENSO CORPORATION, Kariya-city (JP)

(72) Inventors: Ryuki Tomohiro, Kariya-city (JP); Makoto Tashiro, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 138 days.

(21) Appl. No.: 18/628,206

(22) Filed: Apr. 5, 2024

(65) Prior Publication Data

US 2024/0377451 A1　Nov. 14, 2024

(30) Foreign Application Priority Data

May 9, 2023　(JP) ................................. 2023-077265

(51) Int. Cl.
　　G01R 31/26　　　(2020.01)
　　G01R 31/319　　(2006.01)

(52) U.S. Cl.
　　CPC ... G01R 31/2626 (2013.01); G01R 31/31924 (2013.01)

(58) Field of Classification Search
　　CPC .......... G01R 31/2633; G01R 31/31707; G01R 31/2626; G01R 31/31924
　　USPC ....................................................... 324/754
　　See application file for complete search history.

(56) References Cited

U.S. PATENT DOCUMENTS

| | | | | |
|---|---|---|---|---|
| 5,898,321 A * | 4/1999 | Ilkbahar | ............... | H03K 17/164 |
| | | | | 327/170 |
| 5,917,758 A * | 6/1999 | Keeth | ................. | H03K 17/164 |
| | | | | 365/189.11 |
| 6,320,407 B1 | 11/2001 | Sakamoto | | |
| 2005/0231251 A1* | 10/2005 | Im | ........................ | G11C 29/028 |
| | | | | 327/170 |
| 2023/0080033 A1* | 3/2023 | Iorga | .................... | H03K 3/0232 |
| | | | | 327/227 |

FOREIGN PATENT DOCUMENTS

| | | | |
|---|---|---|---|
| JP | 2001-016088 A | 1/2001 | |
| JP | 4887847 B2 | 2/2012 | |

* cited by examiner

*Primary Examiner* — Lee E Rodak
*Assistant Examiner* — Taqi R Nasir
(74) *Attorney, Agent, or Firm* — Posz Law Group, PLC

(57)　　　　　　ABSTRACT

An electronic control device including a control unit and switching elements is inspected. A slew rate of each of the switching elements is observed. A predetermined target slew rate range is stored. It is determined whether an observation result of the slew rate is disposed within or outside the predetermined target slew rate range. A slew rate adjust value is calculated based on a determination result of the observation result when the slew rate is disposed outside the predetermined target slew rate range. The slew rate adjust value is written in a storage unit of the control unit.

8 Claims, 6 Drawing Sheets

FIG. 2

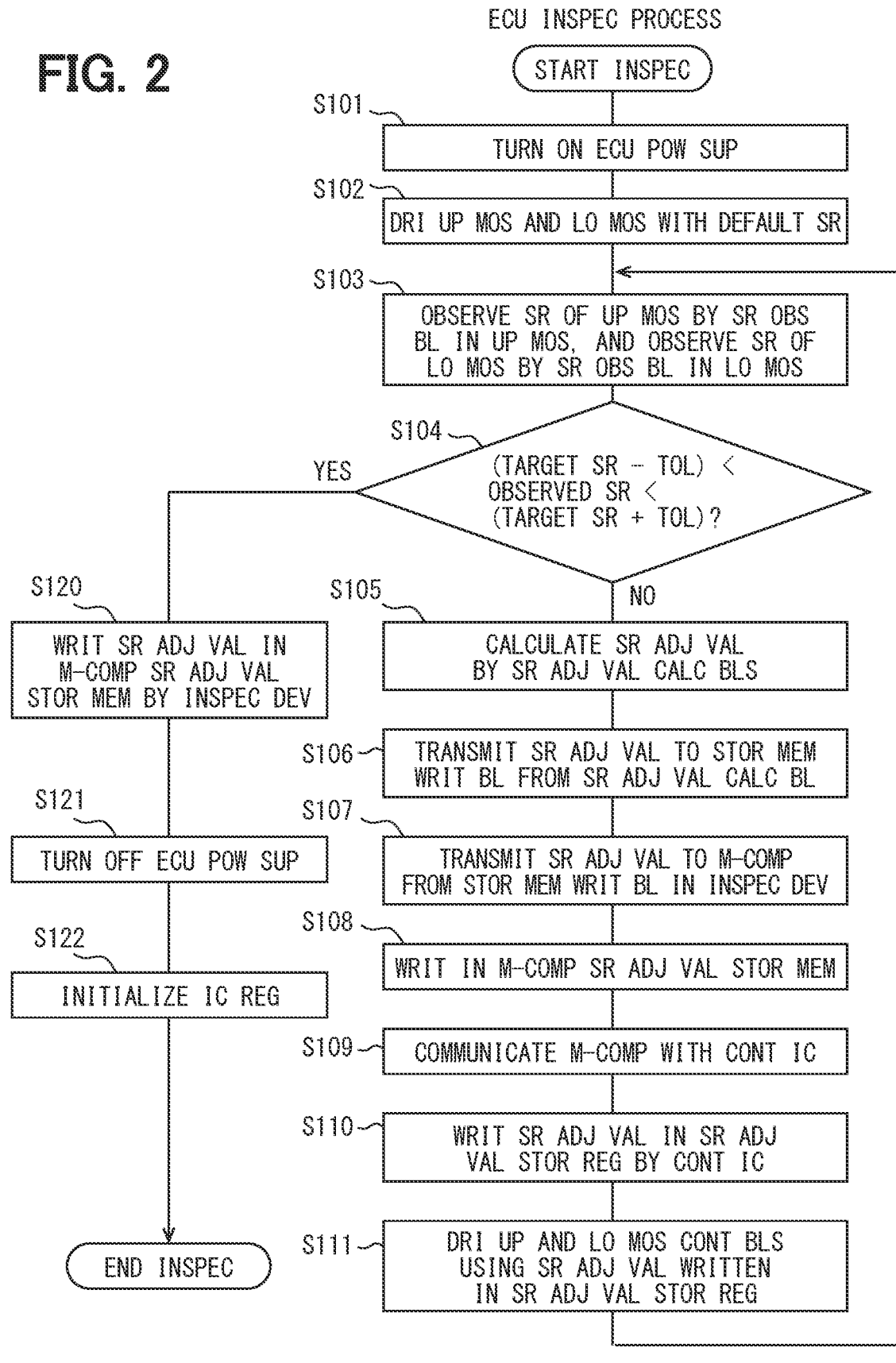

ECU INSPEC PROCESS

START INSPEC

S101 — TURN ON ECU POW SUP

S102 — DRI UP MOS AND LO MOS WITH DEFAULT SR

S103 — OBSERVE SR OF UP MOS BY SR OBS BL IN UP MOS, AND OBSERVE SR OF LO MOS BY SR OBS BL IN LO MOS

S104 — (TARGET SR − TOL) < OBSERVED SR < (TARGET SR + TOL)?

YES

NO

S120 — WRIT SR ADJ VAL IN M-COMP SR ADJ VAL STOR MEM BY INSPEC DEV

S105 — CALCULATE SR ADJ VAL BY SR ADJ VAL CALC BLS

S106 — TRANSMIT SR ADJ VAL TO STOR MEM WRIT BL FROM SR ADJ VAL CALC BL

S121 — TURN OFF ECU POW SUP

S107 — TRANSMIT SR ADJ VAL TO M-COMP FROM STOR MEM WRIT BL IN INSPEC DEV

S122 — INITIALIZE IC REG

S108 — WRIT IN M-COMP SR ADJ VAL STOR MEM

S109 — COMMUNICATE M-COMP WITH CONT IC

S110 — WRIT SR ADJ VAL IN SR ADJ VAL STOR REG BY CONT IC

END INSPEC

S111 — DRI UP AND LO MOS CONT BLS USING SR ADJ VAL WRITTEN IN SR ADJ VAL STOR REG

FIG. 3

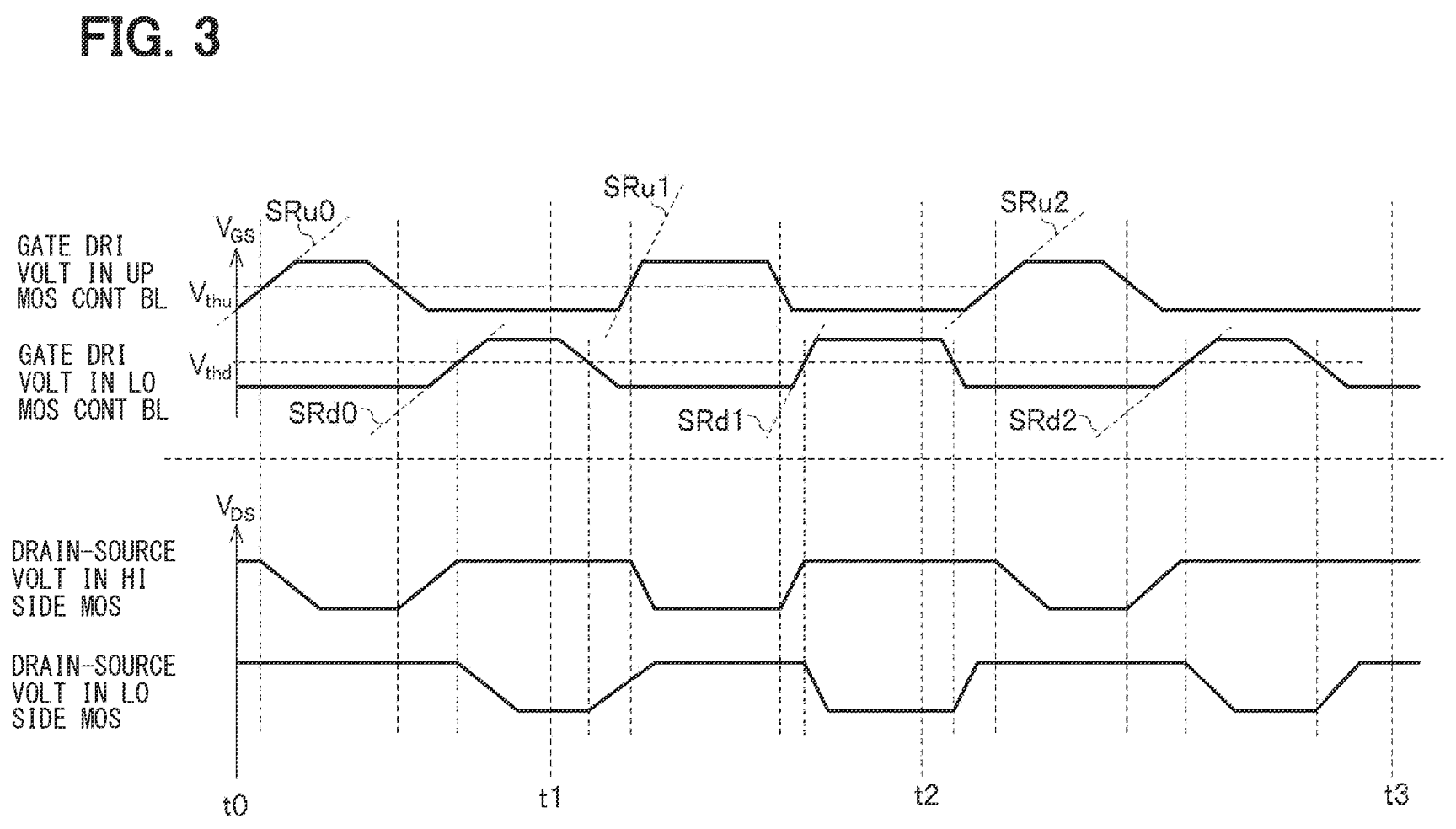

GATE DRI
VOLT IN UP
MOS CONT BL

GATE DRI
VOLT IN LO
MOS CONT BL

DRAIN-SOURCE
VOLT IN HI
SIDE MOS

DRAIN-SOURCE
VOLT IN LO
SIDE MOS $V_{GS}$ $V_{thu}$ $V_{thd}$ $V_{DS}$

SRu0

SRd0

SRu1

SRd1

SRu2

SRd2 t0    t1    t2    t3

FIG. 4

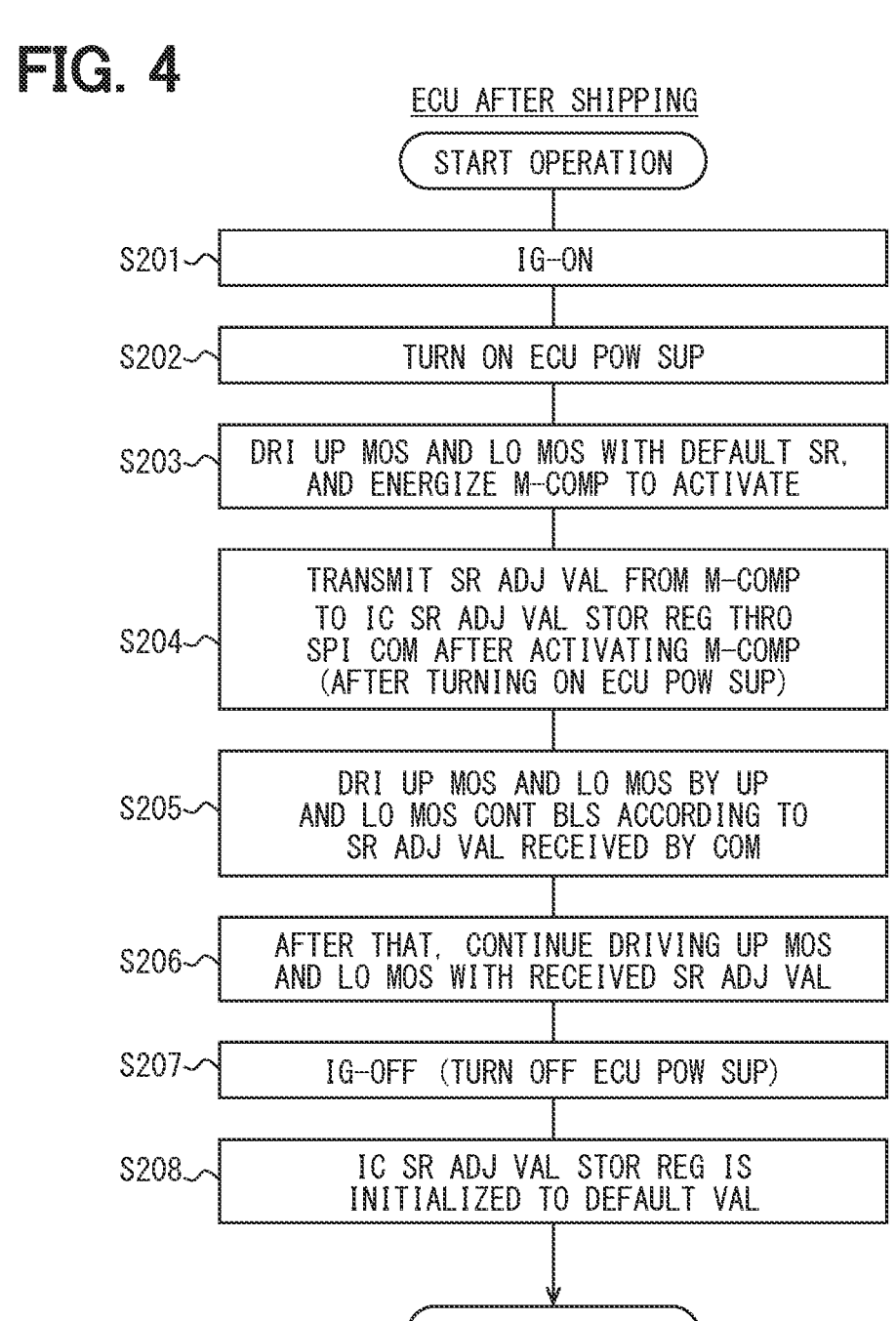

ECU AFTER SHIPPING

START OPERATION

S201 — IG-ON

S202 — TURN ON ECU POW SUP

S203 — DRI UP MOS AND LO MOS WITH DEFAULT SR, AND ENERGIZE M-COMP TO ACTIVATE

S204 — TRANSMIT SR ADJ VAL FROM M-COMP TO IC SR ADJ VAL STOR REG THRO SPI COM AFTER ACTIVATING M-COMP (AFTER TURNING ON ECU POW SUP)

S205 — DRI UP MOS AND LO MOS BY UP AND LO MOS CONT BLS ACCORDING TO SR ADJ VAL RECEIVED BY COM

S206 — AFTER THAT, CONTINUE DRIVING UP MOS AND LO MOS WITH RECEIVED SR ADJ VAL

S207 — IG-OFF (TURN OFF ECU POW SUP)

S208 — IC SR ADJ VAL STOR REG IS INITIALIZED TO DEFAULT VAL

END OPERATION

FIG. 5

COMPARISON EX: CHARACT RESULT BEFORE EXECUTING SR ADJ

|  | SMALL PARA CAPA HI SR | A-TYPE PRODUCT OF MOS | LARGE PARA CAPA LO SR | B-TYPE PRODUCT OF MOS |
|---|---|---|---|---|
| GENERATED NOISE | LARGE | | MEDIUM | |
| SW LOSS | SMALL | | MEDIUM | |
| HEAT | SMALL | | MEDIUM | |
| SUP CUR | SMALL | | MEDIUM | |
| ELE SIZE | SMALL | | MEDIUM | |
| COST | SMALL | | MEDIUM | |

~ K1     K2 ~

COMPARISON EX: CHARACT RESULT AFTER EXECUTING SR ADJ

|  | SMALL PARA CAPA HI SR | A-TYPE PRODUCT OF MOS | LARGE PARA CAPA LO SR | B-TYPE PRODUCT OF MOS |
|---|---|---|---|---|
| GENERATED NOISE | MEDIUM | | SMALL | |
| SW LOSS | MEDIUM | | LARGE | |
| HEAT | MEDIUM | | LARGE | |
| SUP CUR | MEDIUM | | LARGE | |
| ELE SIZE | MEDIUM | | LARGE | |
| COST | MEDIUM | | LARGE | |

FIG. 6

PRESENT EMBODIMENT: CHARACT RESULT AFTER EXECUTING SR ADJ

| | SMALL PARA CAPA HI SR | A-TYPE PRODUCT OF MOS | LARGE PARA CAPA LO SR | B-TYPE PRODUCT OF MOS |
|---|---|---|---|---|
| GENERATED NOISE | MEDIUM | | MEDIUM | |
| SW LOSS | MEDIUM | | MEDIUM | |
| HEAT | MEDIUM | | MEDIUM | |
| SUP CUR | MEDIUM | | MEDIUM | |
| ELE SIZE | MEDIUM | | MEDIUM | |
| COST | MEDIUM | | MEDIUM | |

INSPECTION DEVICE AND ELECTRONIC CONTROL DEVICE

CROSS REFERENCE TO RELATED APPLICATION

The present application claims the benefit of priority from Japanese Patent Application No. 2023-077265 filed on May 9, 2023. The entire disclosure of the above application is incorporated herein by reference.

TECHNICAL FIELD

The present disclosure relates to an inspection device and an electronic control device.

BACKGROUND

An example of the power conversion device is a switching power supply circuit. Conventionally, a switching power supply circuit can generate a certain power supply voltage by complementary turning on and off two switching elements of a power input on the primary side to control the voltage to step up and down according to a conceivable technique. The switching power supply circuit can change the slew rate of the switching element by controlling the turning-on/off speed of the switching element, and can control the conversion efficiency during step-down. In this case, the conversion efficiency can be improved by increasing the turning-on/off speed of the switching element.

SUMMARY

According to an example, an electronic control device including a control unit and switching elements is inspected. A slew rate of each of the switching elements is observed. A predetermined target slew rate range is stored. It is determined whether an observation result of the slew rate is disposed within or outside the predetermined target slew rate range. A slew rate adjust value is calculated based on a determination result of the observation result when the slew rate is disposed outside the predetermined target slew rate range. The slew rate adjust value is written in a storage unit of the control unit.

BRIEF DESCRIPTION OF THE DRAWINGS

The above and other objects, features and advantages of the present disclosure will become more apparent from the following detailed description made with reference to the accompanying drawings. In the drawings:

FIG. 2 is a flowchart of ECU inspection process;

FIG. 3 is a time chart of waveforms of each unit;

FIG. 4 is a flowchart during actual operation of the ECU;

FIG. 5 is a diagram showing characteristic results when the ECU is implemented and operated after the slew rate is inspected using the method of the comparison example; and FIG. 6 is a diagram showing characteristic results when the ECU is implemented and operated after the slew rate is adjusted using the method of the one embodiment.

DETAILED DESCRIPTION

Figure 1:
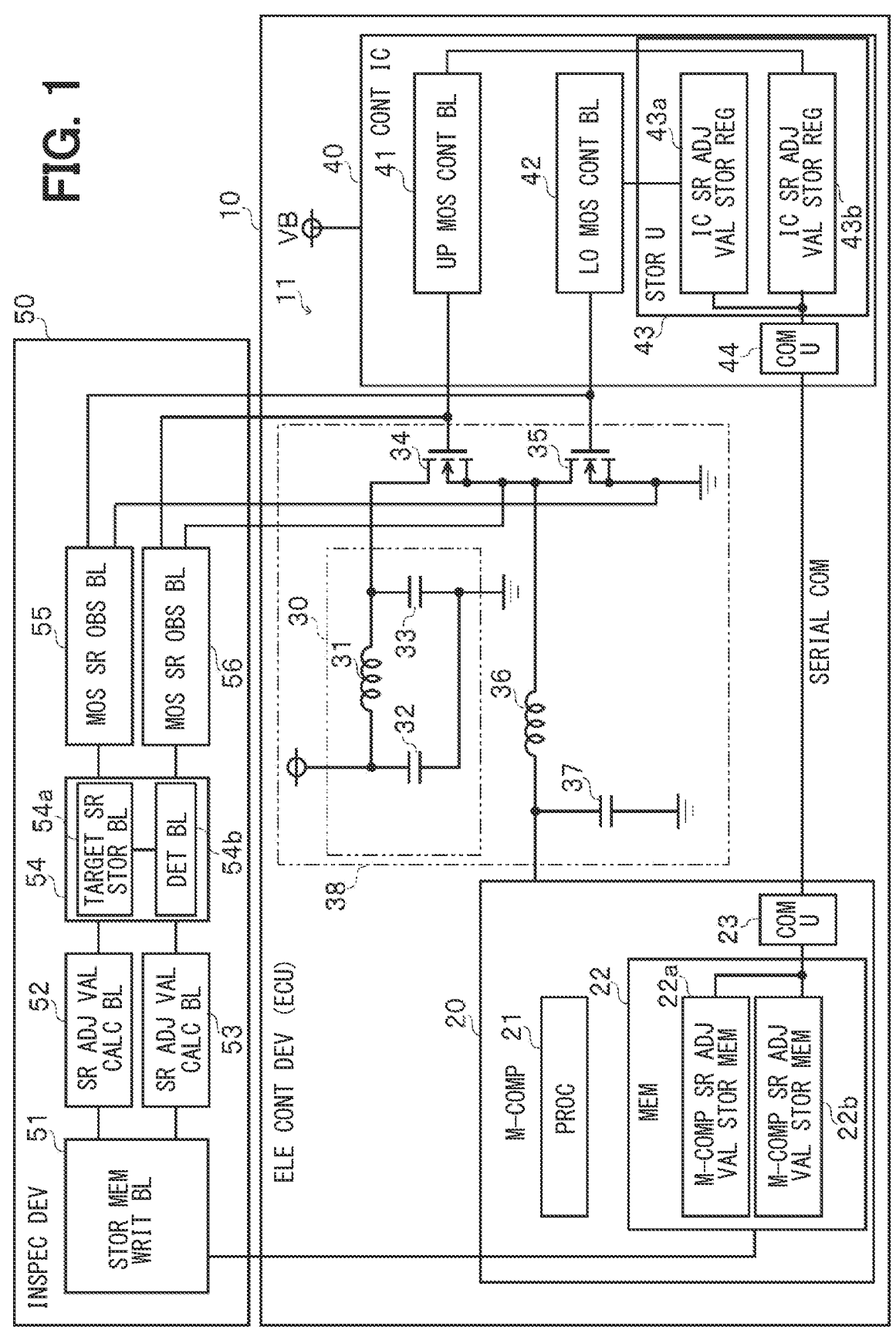
FIG. 1 is a block configuration diagram in an electronic control device and an inspection device according to one embodiment.

A switching power supply circuit according to the conceivable technique reduces the noise generated during a certain voltage generation process by slowing down the turning-on/off speed of the switching element. This makes it possible to reduce the noise generated when the switching element turns on and off, and the noise generated when the current flowing between the energization terminals of the switching element (i.e., between the drain and the source of the MOS transistor) rises up and falls down.

Particularly, in the technical field of electronic control devices for vehicles, generated noise can be kept within standards by generating a target power supply voltage with high power supply efficiency. However, the switching elements used in the switching power supply circuit each have different slew rate characteristics. Therefore, the slew rate of the switching element cannot be grasped by a circuit designer until the circuit is actually implemented on the board.

Therefore, in the design stage, the worst case scenario is taken into account, and it is assumed that a switching element with the maximum slew rate is assembled, and the turning-on/off speed of the switching element is controlled to be slower than the upper limit. Thereby, the generated noise can be kept within the standards.

There are variations in the slew rate of the switching elements. Therefore, actually, a switching element whose slew rate is slower than expected may be assembled. In this case, as described above, if the slew rate of the turning-on/off control is designed to be slow while assuming the worst case scenario, the slew rate will become more slower than expected so that the efficiency may be deteriorated. This becomes a difficulty that occurs in all switching elements for constituting the switching power supply circuit.

According to the present embodiments, an inspection device and an electronic control device are provided to be implemented in accordance with the slew rates of individual switching elements even if the slew rates of the switching elements vary.

The present embodiments according to a first feature is directed to an inspection device that inspects an electronic control device having a plurality of switching elements that are controlled based on commands from a control unit. The slew rate observation unit observes the slew rate of each of the plurality of switching elements. The target slew rate range storage unit stores a preset target slew rate range. The determination unit determines whether the observation result of the slew rate observation unit is disposed within or outside the stored target slew rate range.

The slew rate adjust unit calculates an adjust value of the slew rate based on the determination result of the determination unit when the slew rate is disposed outside the range. The writing unit writes the slew rate adjust value to the storage unit for the control unit that is referenced by the control unit. As a result, the electronic control unit can adjust the slew rate of the switching element by referring to the slew rate adjust value, so even if there are variations in the slew rate of the switching elements, the electronic control unit can be implemented according to the slew rate of each individual switching element.

An embodiment of the inspection device 50 and the electronic control device 10 will be described with reference to the drawings. The electronic control device 10 for a vehicle is configured by implementing a circuit 11 on a printed circuit board. The electronic control unit 10 is defined as an ECU. The ECU is an abbreviation of electronic control unit. This circuit 11 is designed by a designer and is implemented at a manufacturing factory. The circuit 11 implemented at this time is illustrated in FIG. 1. Here, "SR" in FIGS. 1, 2, and 4 stands for slew rate.

The circuit 11 of the electronic control device 10 illustrated in FIG. 1 is a circuit for driving and controlling a load (not shown). The circuit 11 includes a microcomputer 20, a power supply circuit 38, and a control IC 40. The power supply circuit 38 includes a π-type filter 30, a plurality of MOS transistors 34, 35, an inductor 36, and a capacitor 37 in the illustrated form, and constitutes a power conversion device. The MOS transistors 34 and 35 correspond to the switching elements of the present disclosure.

The π-type filter 30, the drain and the source of the MOS transistor 34, and the drain and the source of the MOS transistor 35 are connected in series between the power supply terminal and the ground. The π-type filter 30 is a low-pass filter in which an inductor 31 and capacitors 32 and 33 are combined in a π-type configuration.

The MOS transistors 34 and 35 are each formed of an N-channel type MOSFET. The gates of the MOS transistors 34 and 35 are connected to the control IC 40, and the control IC 40 controls to turn on and off the MOS transistors 34 and 35 in a complementary manner.

A common drain/source connection point of the MOS transistors 34 and 35 is connected to an inductor 36 and a capacitor 37, and this output voltage is input to the microcomputer 20 as a DC power supply. The power supply circuit 38 generates the DC power supply under the control of the control IC 40 and inputs it to the microcomputer 20.

The microcomputer 20 is enabled to operate by being supplied with the power supply generated by the power supply circuit 38. The microcomputer 20 is equipped with a processor 21, a memory 22, and a communication unit 23, and independently executes predetermined control. The memory 22 includes a non-volatile storage units as a slew rate adjust value storage memories 22a and 22b. The memory 22 and the slew rate adjust value storage memories 22a and 22b are used as non-transitory tangible storage medium.

The slew rate adjust value storage memory 22a stores the slew rate adjust value of the high-side MOS transistor 34. The slew rate adjust value storage memory 22b stores the slew rate adjust value of the low-side MOS transistor 35. These slew rate adjust value storage memories 22a and 22b correspond to the storage unit for the control unit of the present disclosure. The communication unit 23 of the microcomputer 20 is configured to be capable of serial communication with the communication unit 44 of the control IC 40.

The control IC 40 includes a so-called ASIC, and the inside of the ASIC includes an upper MOS control block 41, a lower MOS control block 42, a storage unit 43, a communication unit 44, and the like. The ASIC is an abbreviation for Application Specific Integrated Circuit. The upper MOS control block 41 corresponds to a switch control unit that controls the high-side MOS transistor 34. The lower MOS control block 42 corresponds to a switch control unit that controls the low-side MOS transistor 35. The storage unit 43 includes a slew rate adjust value storage register 43a for the high side MOS transistor 34 and a slew rate adjust value storage register 43b for the low side MOS transistor 35 as a storage unit for the switch control unit. In addition, the storage unit 43 includes an area serving as an initial value storage unit that non-volatilely stores the initial value of the slew rate.

The upper MOS control block 41 of the control IC 40 drives and controls the high-side MOS transistor 34. The lower MOS control block 42 of the control IC 40 drives and controls the low-side MOS transistor 35. Such a circuit 11 is mounted in the electronic control device 10.

<Manufacturing Inspection Process>

In the manufacturing process, when configuring the electronic control device 10, external components such as the MOS transistors 34 and 35 and the control IC 40 are mounted on the same printed circuit board. After this, an inspection is performed in an inspection process. In the inspection process, the MOS transistors 34 and 35 and the control IC 40 are mounted on the same printed circuit board, and each component is inspected in a state where it is actually connected to each other. Therefore, the inspection can be performed taking into consideration the characteristics such as the output impedance of the control IC 40 and the input/output characteristics of the MOS transistors 34 and 35, rather than the characteristics of the MOS transistors 34 and 35 alone.

In the inspection process, the inspection device 50 is connected to the electronic control device 10 to perform the inspection. As shown in FIG. 1, the inspection device 50 is configured to have functions of a storage memory write block 51, slew rate adjust value calculation blocks 52 and 53, a target slew rate storage block 54a, a determination block 54b, and MOS slew rate observation blocks 55 and 56. The slew rate adjust value calculation blocks 52 and 53 correspond to a slew rate adjust unit, and the target slew rate storage block 54a corresponds to a target slew rate range storage unit. Further, the determination block 54b corresponds to a determination unit, and the storage memory write block 51 corresponds to a write unit.

The detailed method in the inspection process will be described below with reference to FIG. 2.

In the inspection process, the electronic control device 10 is energized in S101 of FIG. 2. When the electric power is applied to the control IC 40, the control IC 40 drives the high-side MOS transistor 34 with the upper MOS control block 41 at a predetermined default slew rate in S102, and drives the low-side MOS transistor 35 with the lower MOS control block 42. See the slew rate SRu0 of the high-side MOS transistor 34 and the slew rate SRd0 of the low-side MOS transistor 35 from timing t0 to t1 in FIG. 3.

At this time, the high-side MOS transistor 34 and the low-side MOS transistor 35 are turned on and off in a complementary manner. The power supply circuit 38 generates a DC voltage through an inductor 36 and a capacitor 37 and supplies the electric power to the microcomputer 20 by turning on and off the MOS transistors 34 and 35 in a complementary manner.

The MOS slew rate observation block 55 observes the gate-source voltage of the high-side MOS transistor 34. The MOS slew rate observation block 56 observes the gate-source voltage of the low-side MOS transistor 35. The MOS slew rate observation blocks 55 and 56 calculate the slew rate by measuring the arrival time from the off voltage at which the MOS transistors 34 and 35 are turned off to the on threshold voltage at which the MOS transistors 35 are turned on.

A target slew rate is stored in advance in the target slew rate storage block 54a. The target slew rate refers to the slew rate at which the conversion efficiency is highest while satisfying noise standards, and is a value defined when the electronic control device 10 is designed.

The determination block 54b compares the value obtained by adding or subtracting the tolerance to the target slew rate and the slew rate observed by the MOS slew rate observation blocks 55 and 56, and determines whether the observed slew rate is appropriate. Specifically, in S104, the determination block 54b determines whether the observed slew rates of the MOS transistors 34 and 35 satisfy the following condition of an expression of "(target slew rate−tolerance)<observed slew rate<(target slew rate+tolerance). That is, it is determined whether the target slew rate is within or outside the range of the maximum value and minimum value of the slew rate.

The determination block 54b determines "YES" when the condition of S104 is satisfied, and the storage memory write block 51 (as a function of a write unit) writes the observed slew rate as it is as a slew rate adjust value to the slew rate adjust value storage memories 22a and 22b of the microcomputer 20. Alternatively, the storage memory write block 51 may write the slew rate adjusted by the difference obtained by subtracting the target slew rate from the observed slew rate into the slew rate adjust value storage memories 22a and 22b of the microcomputer 20 as the slew rate adjust value.

In this case, the inspection device 50 determines that the slew rate inspection is normal and that the adjustment is completed, turns off the power supply to the electronic control unit 10 in S111, initializes the slew rate adjust value storage registers 43a and 43b inside the storage unit 43 of the control IC 40 in S112, and ends the inspection.

On the other hand, when the determination block 54b determines that the condition in S104 is not satisfied, it is determined that the adjustment is not completed, and in S105 to S109, the adjustment operation is performed to bring the slew rate of the MOS transistors 34 and 35 closer to the target slew rate.

The slew rate adjust value calculation blocks 52 and 53 each calculate a slew rate adjust value based on the determination result of the determination block 54b in S105. The slew rate adjust value indicates the adjusted slew rate itself or a relative adjust value for bringing the slew rate of the drive voltage when driving the MOS transistors 34 and 35 closer to the target slew rate.

In other words, the slew rate adjust value may be an absolute value representing the slew rate itself, or a value predetermined in accordance with a rule corresponding to the absolute value of the actual slew rate. Further, the slew rate adjust value may be a value relative to a certain standard value, or may be a value predetermined in accordance with a rule corresponding to the relative value of the slew rate.

For example, when the actual observed slew rate is smaller than the target slew rate, the slew rate adjust value calculation blocks 52 and 53 calculate the slew rate adjust values to increase the observed slew rate of the MOS transistors 34 and 35. Conversely, when the observed slew rate is greater than the target slew rate, the slew rate adjust value calculation blocks 52 and 53 calculate the slew rate adjust values to lower the observed slew rates of the MOS transistors 34 and 35.

Assuming a case where the target slew rate of the turning-on/off speed of the MOS transistors 34 and 35 is preset to a standard value of 1 V/µs. For example, when the slew rates of the MOS transistors 34 and 35 are observed to be as low as 0.5V/µs, the slew rate adjust value calculation blocks 52 and 53 calculate the slew rate adjust value for the turning-on/off speed of the MOS transistors 34 and 35 to adjust the slew rates to be 1.2V/µs, which is higher than the standard value of the target slew rate.

Then, the slew rate adjust value calculation blocks 52 and 53 transmit the slew rate adjust value to the storage memory write block 51 in S106. The storage memory write block 51 transmits the slew rate adjust value to the microcomputer 20 in S107, and writes the slew rate adjust value to the slew rate adjust value storage memories 22a and 22b in S108.

Thereafter, the communication unit 23 of the microcomputer 20 and the communication unit 44 of the control IC 40 communicate with each other in S109 to transmit the slew rate adjust values stored in the slew rate adjust value storage memories 22a and 22b from the microcomputer 20 to the control IC 40. The control IC 40 writes the slew rate adjust value into the slew rate adjust value storage registers 43a and 43b.

The upper MOS control block 41 drives the high-side MOS transistor 34 based on the slew rate adjust value stored in the slew rate adjust value storage register 43a in S111. At this time, the upper MOS control block 41 applies a gate voltage whose slew rate is adjusted by the slew rate adjust value to the gate of the high side MOS transistor 34.

The lower MOS control block 42 drives the low-side MOS transistor 35 based on the slew rate adjust value stored in the slew rate adjust value storage register 43b in S111. At this time, the lower MOS control block 42 applies a gate voltage whose slew rate is adjusted by the slew rate adjust value to the gate of the low side MOS transistor 35. In such a case, the upper MOS control block 41 and the lower MOS control block 42 generate gate voltages by increasing or decreasing the gate voltages in a stepwise manner through digital processing, and apply the gate voltages to the gates of the MOS transistors 34 and 35.

Then, the process returns to S103. Thereafter, the processes of S105 to S111 are repeated until the determination block 54b determines that the condition of S104 is satisfied. For example, a case is assumed such that, in the first observation of the slew rate in S103, it is observed to be 0.5 V/µs, which is lower than the value of (target slew rate−tolerance), and even after the first processing in S105 to S111 is performed, the slew rate of the MOS transistors 34, 35 is observed to be 0.7 V/µs.

In this case, the slew rate adjust value calculation blocks 52 and 53 calculate the slew rate adjust value of the turning-on/off speed of the MOS transistors 34 and 35 to be 1.4V/µs, which is higher than the previously calculated slew rate adjust value of 1.2V/µs. In this way, by repeating the loop from S103 to S111, the slew rate adjust value can be gradually increased. As a result, even if the observed actual slew rate is significantly lower than the target slew rate, the actual slew rate can be brought closer to the target slew rate by gradually increasing the slew rate adjust value.

On the other hand, a case is assumed such that, in the first observation of the slew rate in S103, it is observed to be higher than the value of (target slew rate+tolerance), and even after the first processing of S105 to S111 is executed, it is observed to be higher than the value of (target slew rate+tolerance). In this case, similar operation is performed. In this case, the slew rate adjust value calculation blocks 52 and 53 of the inspection device 50 calculate the slew rate adjust value to be lower than the standard value at the first time, and they calculate the slew rate adjust value further lower than the standard value at the second time. In this way, by repeating the loop from S103 to S111, the slew rate adjust value can be gradually decreased. As a result, even if the observed actual slew rate is significantly higher than the target slew rate, the actual slew rate can be brought closer to the target slew rate by gradually decreasing the slew rate adjust value.

The determination block 54b determines "YES" when the condition of S104 is satisfied, and the storage memory write block 51 writes the slew rate adjust value into the slew rate adjust value storage memories 22a and 22b of the microcomputer 20

In this case, the inspection device 50 ends the slew rate inspection and determines that the adjustment is complete, turns off the power supply to the electronic control unit 10 in S121, initializes the register of the control IC 40 in S122, and ends the inspection process.

After completing the inspection of the electronic control device 10, the manufacturer removes the inspection device 50 and ships the electronic control device 10. The electronic control device 10 is assembled into a vehicle body (not shown) after shipping. Once the various parts are assembled to the vehicle body, the vehicle can be driven.

When the vehicle is operated, as shown in FIG. 4, when an ignition switch (not shown) is turned on in S201, the electronic control unit 10 is energized to turn on in S202. When the electronic control device 10 is energized to turn on, the control IC 40 is energized to turn on. Here, when the control IC 40 is not energized to turn on, the slew rate adjust value storage registers 43*a* and 43*b* are reset to the slew rate initial values stored in the storage unit 43 in a non-volatile manner. The initial value here indicates a standard value of the slew rate, and it is desirable to set the value at which the slew rate is the steepest within a predetermined range of the design determined in advance as the initial value.

When the control IC 40 of the electronic control device 10 is energized to turn on, the upper MOS control block 41 sets the initial value of the slew rate stored in the storage unit 43, and drives the high-side MOS transistor 34. Further, the lower MOS control block 42 drives the low-side MOS transistor 35 using the initial value of the slew rate stored in the storage unit 43.

The steepest value within a predetermined range is set as the initial value of the slew rate. Therefore, although the amount of noise increases, the heat generation of the MOS transistors 34 and 35 can be suppressed. Therefore, by controlling the MOS transistors 34, 35 using the initial value only for a short period of time immediately after energizing to turn on until the slew rate is adjusted later, it is possible to prevent anomaly from occurring due to heat generation in the MOS transistors 34, 35 and their peripheral circuits. As a result, the microcomputer 20 is energized in S203, and the microcomputer 20 is activated.

When the microcomputer 20 is activated, the microcomputer 20 and the control IC 40 communicate through the communication units 23 and 44 in S204. The slew rate adjust values are written in the slew rate adjust value storage memories 22*a* and 22*b* from the inspection device 50 in advance. The communication unit 23 of the microcomputer 20 reads the slew rate adjust value from the slew rate adjust value storage memories 22*a* and 22*b* of the microcomputer 20, and transmits the slew rate adjust value to the communication unit 44 of the control IC 40 by serial communication. The control IC 40 controls the slew rate adjust value storage registers 43*a* and 43*b* to store the slew rate adjust value therein.

In S205, the upper MOS control block 41 of the control IC 40 drives the high-side MOS transistor 34 in accordance with the slew rate adjust value received by the communication unit 44 and stored in the slew rate adjust value storage register 43*a*. The lower MOS control block 42 of the control IC 40 drives the low-side MOS transistor 35 in accordance with the slew rate adjust value received by the communication unit 44 and stored in the slew rate adjust value storage register 43*b*.

From this point on, as shown in S206, the upper MOS control block 41 continues to drive the high-side MOS transistor 34 according to the received slew rate adjust value, and the lower MOS control block 42 continues to drive the low-side MOS transistor 35 according to the received slew rate adjust value.

Thereafter, when the ignition switch is turned off, the power supply to the electronic control device 10 is also cut off in S207. Then, the control IC 40 resets the stored values in the slew rate adjust value storage registers 43*a* and 43*b* in S208. When the ignition switch is turned on again, the process is repeated from S201.

<Explanation of Technical Features of this Embodiment>

FIG. 5 shows the results of the inspection of the slew rate using the conventional method (i.e., the comparison example), and FIG. 6 shows the results when the slew rate is adjusted using the method of this embodiment. For example, as shown in FIG. 5, A-type product of the MOS transistors 34 and 35 have relatively small parasitic capacitance and a relatively steep slew rate, and B-type product of the MOS transistors 34 and 35 have relatively large parasitic capacitance and a relatively slow slew rate. A plurality of electronic control devices 10, on which the A-type product and the B-type product are respectively mounted, are mass-produced.

In the case of the A-type product, which has a small parasitic capacitance and a steep slew rate, the switching loss, the heat, and the supply current are relatively small, but the noise is large. On the other hand, in the case of the B-type product, which has a large parasitic capacitance and a slow slew rate, the switching loss, the heat, the supply current, and the generated noise can all be suppressed to a moderate level.

When the electronic control devices 10 are manufactured in the same lot using such A-type and B-type products, it is considered that the slew rates of the MOS transistors 34 and 35 are adjusted to be gentler in order to suppress the noise generated in the A-type product. Then, in the electronic control device 10 using the A-type product, although the switching loss, the heat, and the supply current become slightly large and medium, the noise that is generated can be suppressed (see the change of the adjust K1 from "large" to "medium" in FIG. 5).

If the same adjustment as for the A-type product is applied to the B-type product in the same lot, the noise occurring in the B-type product can be suppressed to a small level, but the switching loss, the heat generation, and the supply current will increase, and there is a risk such that the B-type product may deviate from the predetermined specifications (see "Medium" to "Large" in the adjustment K2 in FIG. 5).

On the other hand, by adjusting the slew rate of the A-type product and the B-type product using the inspection device 50 of this embodiment, the slew rate can be adjusted according to each individual component of the A-type product and the B-type product. In the case of the A-type product with small parasitic capacitance, the inspection device 50 observes the slew rate and gently adjusts the slew rate to reduce generated noise as described above, thereby adjusting the switching loss, the heat generation, the supply current, and the generated noise to a medium level. On the other hand, in the case of the B-type product with a large parasitic capacitance, the inspection device 50 observes the slew rate and can detect that the slew rate is moderate compared to the standards, so the slew rate can be adjusted to be steeper. Therefore, the switching loss, the heat generation, and the supply current can be suppressed to a medium level while suppressing the noise generation. As a result, it is possible to suppress the standard size of the components and prevent an increase in the manufacturing cost.

<Summary of the Present Embodiment>

According to this embodiment, the slew rate of the MOS transistors 34 and 35 mounted in the electronic control device 10 is observed by the inspection device 50, and it is determined whether the observed slew rate is disposed within or out of range of the range of the upper limit value and the lower limit value of the target slew rate. At this time, if it is out of range, the slew rate is adjusted to approach the target slew rate by changing the turning-on/off speed of the MOS transistors 34 and 35 each time. Thereby, the inspection device 50 can observe the slew rate of each of the MOS transistors 34 and 35, adjust the slew rate to the optimum slew rate, and write the adjusted value in the memory 22 of the electronic control device 10. As a result, the electronic control device 10 can improve the efficiency of the power supply circuit 38 and suppress noise.

Further, the determination block 54b determines that the adjustment is completed when the observation results of the MOS slew rate observation blocks 55 and 56 are between the maximum value and the minimum value, and when the observation results are not between the maximum value and the minimum value, it is determined that the adjustment is not completed. Thereby, it is possible to determine whether the slew rate is within the range between the maximum value and the minimum value of the target slew rate, and to determine whether the adjustment is completed.

In addition, it is possible to obtain the advantages of reducing the component size in the standards, which has conventionally been increased as a measure against heat caused by deterioration of efficiency, and reducing the associated cost increase. In other words, it is possible to realize to reduce the size of the components by reducing the standards of the components, thereby reducing the manufacturing cost.

The upper MOS control block 41 and the lower MOS control block 42 refer to the slew rate adjust value storage registers 43a and 43b, respectively, and control the slew rate for each of the plurality of MOS transistors 34 and 35. Thus, the slew rate can be controlled for each of the MOS transistors 34 and 35, so that the MOS transistors 34 and 35 can be controlled at a more optimal slew rate.

The initial value storage unit stores in advance the value at which the slew rate is the steepest as the initial value, and immediately after the power supply is turned on, each of the upper MOS control block 41 and the lower MOS control block 42 control the MOS transistors 34 and 35, respectively, according to the initial values stored in the initial value storage unit. Therefore, it is possible to prevent anomaly due to the heat generation in the MOS transistors 34 and 35 immediately after the power supply is turned on.

After the upper MOS control block 41 and the lower MOS control block 42 respectively control the MOS transistors 34 and 35 according to the initial values stored in the initial value storage units, the microcomputer 20 transmits the slew rate adjust values written in advance from the slew rate adjust value storage memories 22a and 22b to the slew rate adjust value storage registers 43a, 43b.

The upper MOS control block 41 and the lower MOS control block 42 control the slew rates of the MOS transistors 34 and 35 based on the slew rate adjust values. Therefore, the microcomputer 20 and the control IC 40 can work together to adjust the slew rate for driving the MOS transistors 34 and 35 using the slew rate adjust value.

Other Embodiments

The present disclosure is not limited to the above-described embodiments, i.e., may be modified or expanded in the following manner.

When the inspection device 50 inspects the MOS transistors 34 and 35, either the on-time slew rate or the off-time slew rate of the MOS transistors 34 and 35 may be observed, or both may be observed. Alternatively, only the slew rates when the MOS transistors 34 and 35 are turned on may be observed and only the on-time slew rates may be adjusted, or only the slew rates when the MOS transistors 34 and 35 are turned off may be observed and only the off-time slew rates may be adjusted. That is, the "slew rate" may be any of the on-time slew rate, the off-time slew rate, and both the on-time and off-time slew rates.

Although the embodiment has been described in which the slew rate adjust value storage memories 22a and 22b of the microcomputer 20 are built in the microcomputer 20, they may not be limited to being built in the microcomputer 20. The memory 22 that stores the slew rate adjust value may be configured externally to the microcomputer 20.

Although a configuration using the MOS transistors 34 and 35 has been described, various switching elements such as bipolar junction transistors and IGBTs may be applied.

The inspection device 50, the electronic control device 10, and the technique according to the present disclosure may be achieved by a dedicated computer provided by constituting a processor and a memory programmed to execute one or more functions embodied by a computer program. Alternatively, the above described inspection device 50, the electronic control device 10, and the technique according to the present disclosure may be achieved by a dedicated computer provided by constituting a processor with one or more dedicated hardware logic circuits.

Alternatively, the above described inspection device 50, the electronic control device 10, and the technique according to the present disclosure may be achieved using one or more dedicated computers constituted by a combination of the processor and the memory programmed to execute one or more functions and the processor with one or more hardware logic circuits. Furthermore, the computer program may be stored in a computer-readable non-transition tangible recording medium as an instruction executed by a computer.

Namely, the means and/or the functions which are provided by the processor and the like may be provided by software stored in tangible memory devices and computers for executing them, only software, only hardware, or a combination thereof. For example, some or all of the functions provided by the processor may be realized as hardware. A mode in which a certain function is realized as hardware includes a mode in which one or more ICs are used.

The features of the present disclosure include the following features in addition to the features described below.

[1] An inspection device for inspecting an electronic control device (10) including a control unit (20) and a plurality of switching elements (34, 35), the inspection device includes:

a slew rate observation unit (55, 56) that observes a slew rate of each of the plurality of switching elements;

a target slew rate range storage unit (54a) that stores a predetermined target slew rate range;

a determination unit (54b) that determines whether an observation result of the slew rate observation unit is disposed within or outside the predetermined target slew rate range;

a slew rate adjust unit (52, 53) that calculates a slew rate adjust value based on a determination result of the determination unit when the observation result is disposed outside the predetermined target slew rate range; and

a write unit (51) that writes the slew rate adjust value to a control unit storage unit (22) that is referenced by the control unit.

[2] In the inspection device according to an aspect of [1], a maximum value and a minimum value of the target slew rate range are preliminarily set in the target slew rate range storage unit, and the determination unit determines that an adjustment is completed when the observation result of the slew rate observation unit is disposed between the maximum value and the minimum value, and determines that the adjustment is not completed when the observation result of the slew rate observation unit is not disposed between the maximum value and the minimum value.

[3] An electronic control device (10) includes:
a control unit (20);
a plurality of switching elements (34, 35);
a storage unit (22, 22*a*, 22*b*) of the control unit into which a slew rate adjust value is written in advance by an inspection device; and
a plurality of switch control units (41, 42) provided corresponding to the plurality of switching elements.

The plurality of switch control units respectively control the plurality of switching elements based on slew rate adjust values stored in the storage unit of the control unit.

[4] In the electronic control device according to an aspect of [3], the slew rate adjust value stored in the storage unit of the control unit is stored in other storage units (43*a*, 43*b*) of the switch control units different from the storage unit of the control unit through communication, and the plurality of switch control units respectively control the plurality of switching elements based on slew rate adjust values stored in the storage units of the switch control units.

[5] The electronic control device according to an aspect of [3] or [4], includes: a plurality of storage units of the switch control units are provided for the plurality of switching elements, respectively. The plurality of switch control units respectively refer to the storage units of the switch control units, and control a slew rate for each of the plurality of switching elements.

[6] The electronic control device according to any one of aspects of [3] to [5], includes: an initial value storage unit that stores in advance a value at which a slew rate becomes steepest within a predetermined range as an initial value. Immediately after an electric power supply is turned on, the plurality of switch control units respectively control the plurality of switching elements according to the initial value stored in the initial value storage unit.

[7] In the electronic control device according to any one of aspects of [3] to [6], after the plurality of switch control units respectively control the plurality of switching elements according to the initial value, the control unit transmits the slew rate adjust value from the storage unit of the control unit written in advance to the storage unit of the switch control unit, and the plurality of switch control units control a slew rate of each of the plurality of switching elements based on the slew rate adjust value.

Although the present disclosure is described based on the above embodiment, the present disclosure is not limited to the embodiment and the structure. The present disclosure incorporates various modifications and variations within the scope of equivalents. In addition, various combinations and forms, and further, other combinations and forms including only one element, or more or less than these elements are also within the sprit and the scope of the present disclosure.

In the drawing, 10 is an electronic control device, 20 is a microcomputer (i.e., a control unit), 22*a* and 22*b* are slew rate adjust value storage memories (i.e., storage units for the control unit), 34 and 35 are MOS transistors (i.e., switching elements), and 41 is an upper MOS control block (i.e., a switch control unit), 42 is a lower MOS control block (i.e., a switch control unit), 43*a*, 43*b* are slew rate adjust value storage registers (i.e., a switch storage unit of the control unit), 50 is an inspection device, 51 is a storage memory write block (i.e., a write unit), 52 and 53 are slew rate adjust value calculation blocks (i.e., slew rate adjust units), 54*a* is a target slew rate storage block (i.e., a target slew rate range storage unit), and 54*b* is a determination block (a determination unit).

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

It is noted that a flowchart or the processing of the flowchart in the present application includes sections (also referred to as steps), each of which is represented, for instance, as S101. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An inspection device for inspecting an electronic control device including a control unit and a plurality of switching elements, the inspection device comprising:
a slew rate observation unit that observes a slew rate of each of the plurality of switching elements;
a target slew rate range storage unit that stores a predetermined target slew rate range;
a determination unit that determines whether an observation result of the slew rate observation unit is disposed within or outside the predetermined target slew rate range;
a slew rate adjust unit that calculates a slew rate adjust value based on a determination result of the determination unit when the slew rate is disposed outside the predetermined target slew rate range; and
a write unit that writes the slew rate adjust value to a storage unit of the control unit that is referenced by the control unit;
wherein the inspection device is external to and physically separate from the electronic control device.

2. The inspection device according to claim 1, wherein:

a maximum value and a minimum value of the predetermined target slew rate range are preliminarily set in the target slew rate range storage unit; and the determination unit determines that adjustment is completed when the observation result of the slew rate observation unit is disposed between the maximum value and the minimum value, and determines that the adjustment is not completed when the observation result is not disposed between the maximum value and the minimum value.

3. The inspection device according to claim 1, further comprising:

one or more processors, wherein:

the one or more processors provide at least one of: the slew rate observation unit; the determination unit; the slew rate adjust unit; and the write unit.

4. An electronic control device comprising:

a control unit;

a plurality of switching elements;

a storage unit of the control unit into which a slew rate adjust value is written in advance by an inspection device, wherein the inspection device is external to and separate from the electronic control device; and a plurality of switch control units provided corresponding to the plurality of switching elements, wherein:

each of the plurality of switch control units controls one of the plurality of switching elements based on slew rate adjust value stored in the storage unit of the control unit.

5. The electronic control device according to claim 4, wherein:

the slew rate adjust value stored in the storage unit of the control unit is stored in an other storage unit of the one of the switch control units different from the storage unit of the control unit through communication; and each of the plurality of switch control units controls the one of the plurality of switching elements based on the slew rate adjust value stored in the other storage unit of the one of the switch control units.

6. The electronic control device according to claim 5, further comprising:

a plurality of other storage units of the switch control units that are provided for the plurality of switching elements, respectively, wherein:

each of the plurality of switch control units controls a slew rate for one of the plurality of switching elements by referring to one of the other storage units of the switch control units.

7. The electronic control device according to claim 4, further comprising:

an initial value storage unit that stores in advance a value at which a slew rate becomes steepest within a predetermined range as an initial value, wherein:

immediately after an electronic power supply is turned on, each of the plurality of switch control units controls one of the plurality of switching elements according to the initial value stored in the initial value storage unit.

8. The electronic control device according to claim 7, wherein:

after each of the plurality of switch control units controls one of the plurality of switching elements according to the initial value, the control unit transmits the slew rate adjust value written in advance from the storage unit of the control unit to an other storage unit of one of the switch control units; and each of the plurality of switch control units controls a slew rate of one of the switching elements based on the slew rate adjust value.

* * * * *